US010574928B2

(12) United States Patent
Nikai et al.

(10) Patent No.: US 10,574,928 B2
(45) Date of Patent: Feb. 25, 2020

(54) SOLID-STATE IMAGING ELEMENT AND METHOD FOR CONTROLLING SOLID-STATE IMAGING ELEMENT

(71) Applicant: SONY SEMICONDUCTOR SOLUTIONS CORPORATION, Kanagawa (JP)

(72) Inventors: Norihiro Nikai, Fukuoka (JP); Yuusuke Nishida, Fukuoka (JP); Hayato Gouji, Fukuoka (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/314,919

(22) PCT Filed: May 1, 2017

(86) PCT No.: PCT/JP2017/017108
§ 371 (c)(1),
(2) Date: Mar. 21, 2019

(87) PCT Pub. No.: WO2018/012088
PCT Pub. Date: Jan. 18, 2018

(65) Prior Publication Data
US 2019/0222788 A1 Jul. 18, 2019

(30) Foreign Application Priority Data
Jul. 13, 2016 (JP) ................................. 2016-138683

(51) Int. Cl.
H04N 5/378 (2011.01)
H04N 5/3745 (2011.01)
H01L 27/146 (2006.01)

(52) U.S. Cl.
CPC ......... *H04N 5/378* (2013.01); *H04N 5/37455* (2013.01); *H01L 27/14609* (2013.01)

(58) Field of Classification Search
CPC .... H04N 5/378; H04N 5/37455; H04N 5/374; H04N 5/357; H04N 19/182;
(Continued)

(56) References Cited

U.S. PATENT DOCUMENTS 6,847,399 B1 * 1/2005 Ang ........................ H04N 5/378
348/308
8,946,798 B2 * 2/2015 Horiike ............. H01L 27/14623
257/294
(Continued)

FOREIGN PATENT DOCUMENTS

CN 106416228 A 2/2017
JP 2006-333035 A 12/2006
(Continued)

OTHER PUBLICATIONS

International Search Report and Written Opinion of PCT Application No. PCT/JP2017/017108, dated Jul. 18, 2017, 08 pages of ISRWO.

Primary Examiner — Yogesh K Aggarwal
(74) Attorney, Agent, or Firm — Chip Law Group

(57) ABSTRACT

To reduce influence occurring between signals simultaneously outputted from two pixels of the same pixel column via mutually different signal lines as much as possible. A solid-state imaging element including: a pixel column in which a plurality of pixels are juxtaposed in a column form; three or more juxtaposed signal lines each used for an output of a pixel included in the pixel column; and an A/D conversion section configured to convert an analog voltage outputted by the pixel to the signal line to a digital value. For a first pixel and a second pixel included in the pixel column, signal lines of connection destinations of these pixels are
(Continued)

different from each other, and timings of outputs of analog voltages of these pixels to the signal lines coincide, an output from the first pixel to the signal line is permitted and an output from the second pixel to the signal line is disabled in a case where a prescribed number of one or more of signal lines or shield lines do not exist between the signal line that is a connection destination of the first pixel and the signal line that is a connection destination of the second pixel, and both outputs from the first pixel and the second pixel to the signal lines are permitted in a case where the prescribed number or more of signal lines or shield lines exist between the signal line that is a connection destination of the first pixel and the signal line that is a connection destination of the second pixel.

10 Claims, 11 Drawing Sheets

(58) Field of Classification Search
CPC ............ H01L 27/14609; H01L 27/326; H01L 27/14603; G02F 2001/1635; G09G 2310/0259

USPC ........ 348/294–324; 250/208.1; 257/290–292
See application file for complete search history.

(56) References Cited

U.S. PATENT DOCUMENTS

| | | |
|---|---|---|
| 2008/0170137 A1 | 7/2008 | Matsumoto et al. |
| 2013/0182163 A1 | 7/2013 | Kobayashi et al. |
| 2015/0062396 A1 | 3/2015 | Yamaoka |

FOREIGN PATENT DOCUMENTS

| | | |
|---|---|---|
| JP | 2009-284553 A | 12/2009 |
| JP | 2013-168634 A | 8/2013 |
| JP | 2015-050478 A | 3/2015 |
| JP | 2016-012904 A | 1/2016 |
| KR | 10-2017-0016828 A | 2/2017 |

* cited by examiner

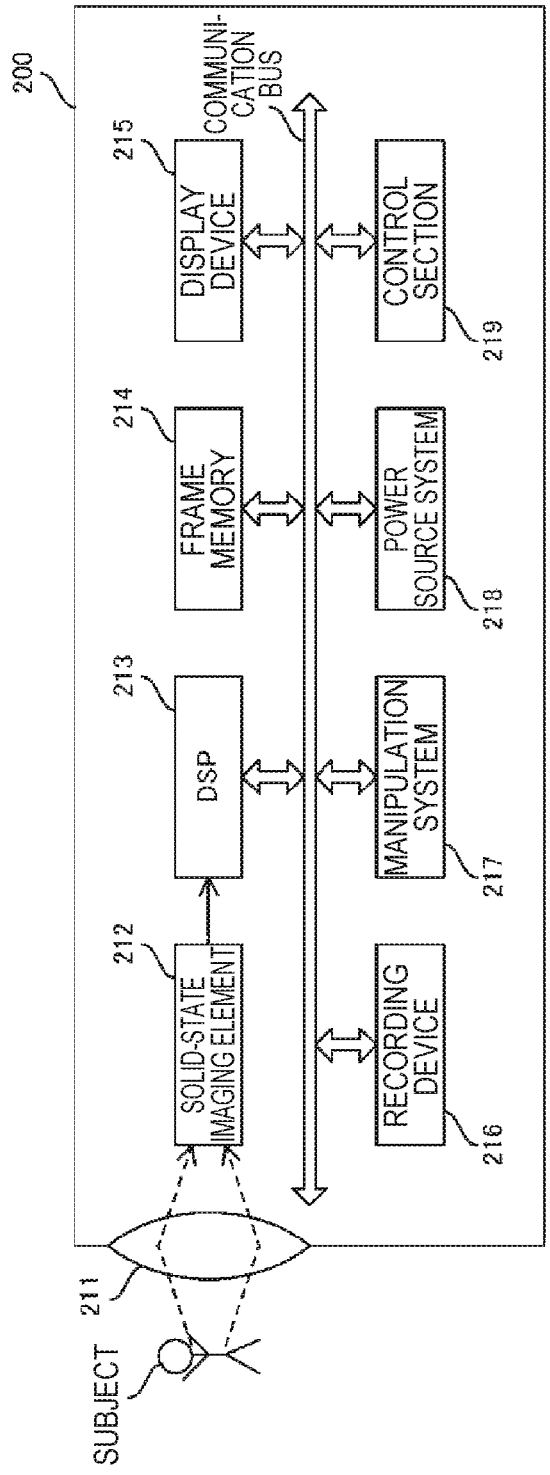

SOLID-STATE IMAGING ELEMENT AND METHOD FOR CONTROLLING SOLID-STATE IMAGING ELEMENT

CROSS REFERENCE TO RELATED APPLICATIONS

This application is a U.S. National Phase of International Patent Application No. PCT/JP2017/017108 filed on May 1, 2017, which claims priority benefit of Japanese Patent Application No. JP 2016-138683 filed in the Japan Patent Office on July 13, 2016. Each of the above-referenced applications is hereby incorporated herein by reference in its entirety.

TECHNICAL FIELD

The present technology relates to a solid-state imaging element and a method for controlling a solid-state imaging element.

BACKGROUND ART

Thus far, a technology that performs signal output simultaneously from a plurality of pixels belonging to the same pixel column has been known (for example, see Patent Literature 1).

Patent Literature 1 discloses a solid-state imaging element of a configuration in which a plurality of vertical signal lines are provided to correspond to pixel columns of a pixel array section, two column circuits (signal processing circuits) each of which performs prescribed signal processing on pixel signals outputted through the corresponding one of the plurality of vertical signal lines are arranged for each pixel column, and high-sensitivity signals and low-sensitivity signals outputted from one pixel through vertical signal lines are processed in parallel by the two column circuits. A signal outputted from each pixel of a selected row is supplied to one of the two column circuits through the corresponding one of the vertical signal lines.

The scanning of the pixel array section is performed on a pixel row basis. Types of scanning include electronic shutter scanning for removing charge accumulated in a photoelectric conversion element of a pixel and readout scanning for reading out charge accumulated in the photoelectric conversion element. In the technology described in Patent Literature 1, readout scanning is performed twice.

In a case where the time required to perform scanning from a pixel row on which electronic shutter scanning is performed (hereinafter, a "shutter row") to a pixel row on which the first round of readout scanning is performed (hereinafter, "readout row 1") is referred to as accumulation time 1 and the time required to perform scanning from readout row 1 to a pixel row on which the second round of readout scanning is performed (hereinafter, "readout row 2") is referred to as accumulation time 2, two signals with different sensitivities, that is, a low-sensitivity signal and a high-sensitivity signal can be obtained by making accumulation times 1 and 2 different.

CITATION LIST

Patent Literature

Patent Literature 1: JP 2006-333035A

DISCLOSURE OF INVENTION

Technical Problem

However, in the technology described in Patent Literature 1 above, the output period of readout row 1 and the output period of readout row 2 overlap partially, and therefore there is a period in which part of a low-sensitivity signal outputted from readout row 1 and part of a high-sensitivity signal outputted from readout row 2 are outputted simultaneously. That is, a state in which one of pixels belonging to a pixel column (hereinafter, "pixel 1") outputs a low-sensitivity signal and another of the pixels belonging to the same pixel column (hereinafter, "pixel 2") outputs a high-sensitivity signal occurs.

Hence, for pixel 1 and pixel 2 belonging to the same pixel column, signals are outputted simultaneously from pixel 1 to one column circuit via one of vertical signal lines provided to correspond to the same pixel column (hereinafter, "vertical signal line 1") and from pixel 2 to the other column circuit via the other of the vertical signal lines provided to correspond to the same pixel column (hereinafter, "vertical signal line 2").

In this event, signals of mutually different rows are outputted via vertical signal line 1 and vertical signal line 2; hence, there is a possibility that, due to a capacitive coupling between vertical signal line 1 and vertical signal line 2, the signal outputted via vertical signal line 1 and the signal outputted via vertical signal line 2 will influence each other and a defect will occur in an image.

The present technology has been made in view of the problem mentioned above, and an object of the present technology is to, in a solid-state imaging element including juxtaposed three or more signal lines each of which is used for outputs of pixels included in a pixel column in which a plurality of pixels are juxtaposed in a column form, reduce influence occurring between a signal outputted via one signal line and a signal outputted via another signal line as much as possible in a case where signal output is performed simultaneously from two pixels of the same pixel column via mutually different signal lines.

Solution to Problem

An aspect of the present technology is a solid-state imaging element including: a pixel column in which a plurality of pixels are juxtaposed in a column form; three or more juxtaposed signal lines each used for an output of a pixel included in the pixel column; and an A/D conversion section configured to convert an analog voltage outputted by the pixel to the signal line to a digital value. For a first pixel and a second pixel included in the pixel column, signal lines of connection destinations of these pixels are different from each other, and timings of outputs of analog voltages of these pixels to the signal lines coincide, an output from the first pixel to the signal line is permitted and an output from the second pixel to the signal line is disabled in a case where a prescribed number of one or more of signal lines or shield lines do not exist between the signal line that is a connection destination of the first pixel and the signal line that is a connection destination of the second pixel, and both outputs from the first pixel and the second pixel to the signal lines are permitted in a case where the prescribed number or more of signal lines or shield lines exist between the signal line that is a connection destination of the first pixel and the signal line that is a connection destination of the second pixel.

In addition, another aspect of the present technology is a method for controlling a solid-state imaging element, the solid-state imaging element including a pixel column in which a plurality of pixels are juxtaposed in a column form, three or more juxtaposed signal lines each used for an output of a pixel included in the pixel column, and an A/D conversion section configured to convert an analog voltage outputted by the pixel to the signal line to a digital value. For a first pixel and a second pixel included in the pixel column, signal lines of connection destinations of these pixels are different from each other, and timings of outputs of analog voltages of these pixels to the signal lines coincide. The method includes: a step of permitting an output from the first pixel to the signal line and disabling an output from the second pixel to the signal line in a case where a prescribed number of one or more of signal lines or shield lines do not exist between the signal line that is a connection destination of the first pixel and the signal line that is a connection destination of the second pixel; and a step of permitting both outputs from the first pixel and the second pixel to the signal lines in a case where the prescribed number or more of signal lines or shield lines exist between the signal line that is a connection destination of the first pixel and the signal line that is a connection destination of the second pixel.

Note that the solid-state imaging element described above has various aspects, such as being worked in a state of being incorporated in another apparatus and being worked together with another method. The method for controlling a solid-state imaging element described above has various aspects, such as being implemented as part of another method and being implemented as an imaging device that includes means corresponding to the steps.

Advantageous Effects of Invention

According to the present technology, in a solid-state imaging element including juxtaposed three or more signal lines each of which is used for outputs of pixels included in a pixel column in which a plurality of pixels are juxtaposed in a column form, influence occurring between a signal outputted via one signal line and a signal outputted via another signal line can be reduced as much as possible in a case where signal output is performed simultaneously from two pixels of the same pixel column via mutually different signal lines. Note that the effects described in the present specification are only examples and are not limitative ones, and there may be additional effects.

BRIEF DESCRIPTION OF DRAWINGS

FIG. 11 is a block diagram showing a configuration of an imaging device.

MODE(S) FOR CARRYING OUT THE INVENTION

Figure 1:
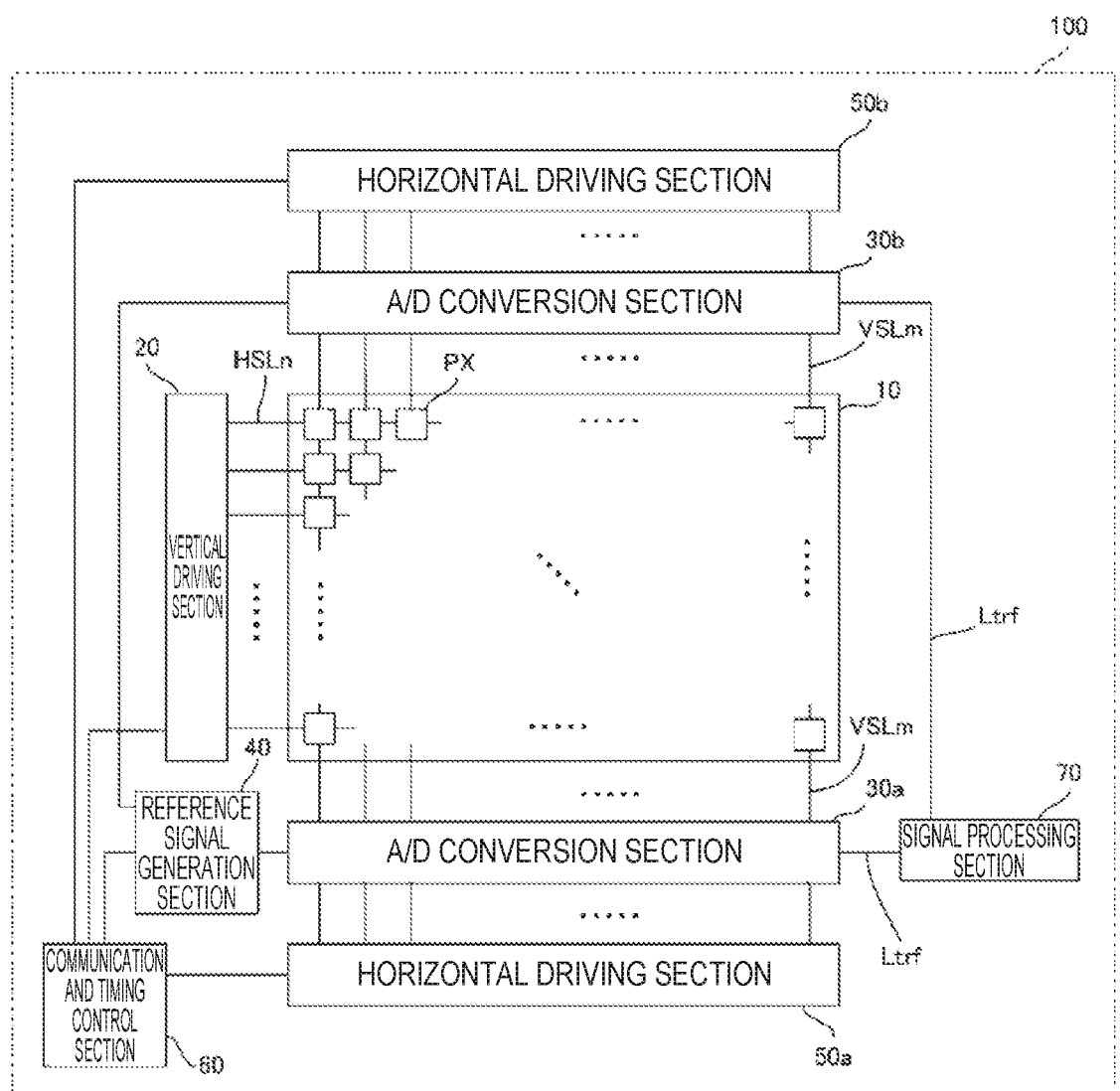
FIG. 1 is a block diagram showing a configuration of a solid-state imaging element.

Hereinbelow, the present technology is described in the following order.
(A) First embodiment
(B) Second embodiment
(A) First Embodiment FIG. 1 is a block diagram showing a configuration of a solid-state imaging element 100. In the present embodiment, a description is given using a CMOS image sensor, which is a kind of X-Y address-type solid-state imaging element, as an example of the solid-state imaging element. Hereinbelow, a specific example of the solid-state imaging element is described with reference to FIG. 1.

In FIG. 1, the solid-state imaging element 100 includes a pixel section 10, a vertical driving section 20, analog/digital conversion sections 30a and 30b (A/D conversion sections 30a and 30b), a reference signal generation section 40, horizontal driving sections 50a and 50b, a communication and timing control section 60, and a signal processing section 70.

In the pixel section 10, a plurality of pixels PX each including a photodiode as a photoelectric conversion element are arranged in a two-dimensional matrix form. A color filter array in which the colors of filters are partitioned to correspond to pixels is provided on the light receiving surface side of the pixel section 10. Note that a specific circuit configuration of the pixel PX is described later in detail.

In the pixel section 10, n pixel driving lines HSLn (n=1, 2, . . . ) and m vertical signal lines VSLm (m=1, 2, . . . ) as signal lines are drawn. The pixel driving lines HSLn are drawn along the left and right direction of the drawing (the pixel arrangement direction of a pixel row, the horizontal direction) that is the column direction, and are provided side by side at equal intervals in the up and down direction of the drawing that is the row direction. The vertical signal lines VSLm are drawn along the up and down direction of the drawing (the pixel arrangement direction of a pixel column, the vertical direction), and are provided side by side along the left and right direction of the drawing. Three or more (in the present embodiment, four) vertical signal lines VSLm are juxtaposed for each pixel column.

One end of the pixel driving line HSLn is connected to an output terminal corresponding to each row of the vertical driving section 20. The vertical signal line VSLm is connected to the pixels PX of the corresponding pixel column. One end of the vertical signal line VSLm is connected to the A/D conversion section 30a or the A/D conversion section 30b. Under the control of the communication and timing control section 60, the vertical driving section 20 and the horizontal driving sections 50a and 50b perform control for sequentially reading out analog signals from pixels PX included in the pixel section 10. Note that a specific connection of the pixel driving line HSLn and the vertical signal line VSLm to each pixel PX is described later along with a description of the pixel PX.

The communication and timing control section 60 includes a timing generator and a communication interface, for example. The timing generator generates various clock signals on the basis of a clock (a master clock) inputted from the outside. The communication interface receives data that specify operating modes, etc. given from the outside of a solid-state imaging element 12, and outputs data including inside information of the solid-state imaging element 12 to the outside.

On the basis of a master clock, the communication and timing control section 60 generates a clock with the same frequency as the frequency of the master clock, a clock with a frequency obtained by dividing the master clock's frequency by 2, a clock with a lower speed obtained by dividing the master clock's frequency by a larger number, etc., and supplies them to the sections in the device (the vertical driving section 20, the horizontal driving sections 50a and 50b, the A/D conversion sections 30a and 30b, the reference signal generation section 40, the signal processing section 70, etc.).

The vertical driving section 20 includes a shift register, an address decoder, etc., for example. The vertical driving section 20 includes a vertical address setting section for controlling the row address and a row scanning control section for controlling row scanning, on the basis of a signal obtained by decoding a video signal inputted from the outside.

The vertical driving section 20 can perform readout scanning and sweep scanning.

The readout scanning is scanning that sequentially selects unit pixels from which signals are to be read out. The readout scanning is basically performed in a sequential manner on a row basis; however, in a case where thinning-out of pixels is performed by adding or averaging outputs of a plurality of pixels that are in a prescribed positional relationship, the readout scanning is performed in a prescribed order.

The sweep scanning is scanning that is performed on a row or a pixel combination that is to be read out by readout scanning and that causes the unit pixels belonging to the row or the pixel combination to be reset prior to the readout scanning by a time equal to the time of the shutter speed.

The horizontal driving sections 50a and 50b sequentially select ADC circuits included in the A/D conversion sections 30a and 30b, respectively, in synchronization with a clock outputted by the communication and timing control section 60. Each of the A/D conversion sections 30a and 30b includes ADC circuits provided for the vertical signal lines VSLm (m=1, 2, . . . ); and converts an analog signal outputted from each vertical signal line VSLm to a digital signal, and outputs the digital signal to a horizontal signal line Ltrf in accordance with the control of the corresponding one of the horizontal driving sections 50a and 50b.

Each of the horizontal driving sections 50a and 50b includes a horizontal address setting section and a horizontal scanning section, for example; and selects an ADC circuit of the corresponding one of the A/D conversion sections 30a and 30b, which circuit corresponds to a readout column in the horizontal direction specified by the horizontal address setting section, and thereby guides a digital signal generated in the selected ADC circuit to the horizontal signal line Ltrf.

Digital signals thus outputted from the A/D conversion sections 30a and 30b are inputted to the signal processing section 70 via the horizontal signal lines Ltrf. The signal processing section 70 performs processing in which signals outputted from the pixel section 10 via the A/D conversion sections 30a and 30b are converted to an image signal corresponding to the color arrangement of the color filter array by arithmetic processing.

Further, the signal processing section 70 performs, as necessary, processing in which pixel signals in the horizontal direction and the vertical direction are thinned out by addition, averaging, or the like. An image signal thus generated is outputted to the outside of the solid-state imaging element 12.

The reference signal generation section 40 includes a digital/analog converter (DAC), and generates a reference signal Vramp (see FIG. 4 etc. described later) in synchronization with a counting clock supplied from the communication and timing control section 60. The reference signal Vramp has a saw-tooth-like wave (a ramp waveform) that temporally changes in a staircase form from the initial value supplied from the communication and timing control section 60. The reference signal Vramp is supplied to each of the ADC circuits of the A/D conversion sections 30a and 30b.

Each of the A/D conversion sections 30a and 30b includes a plurality of ADC circuits. When A/D-converting an analog voltage outputted from each pixel PX, the ADC circuit uses a comparator to compare the reference signal Vramp and the voltage of the vertical signal line VSLm in a prescribed A/D conversion period (a P-phase period or a D-phase period described later), and uses a counter to count a time period before or after the time at which the magnitude relationship between the reference signal Vramp and the voltage of the vertical signal line VSLm (a pixel voltage) is reversed. Thereby, a digital signal in accordance with the analog pixel voltage can be generated. Note that a specific example of the A/D conversion sections 30a and 30b is described later.

Figure 2:
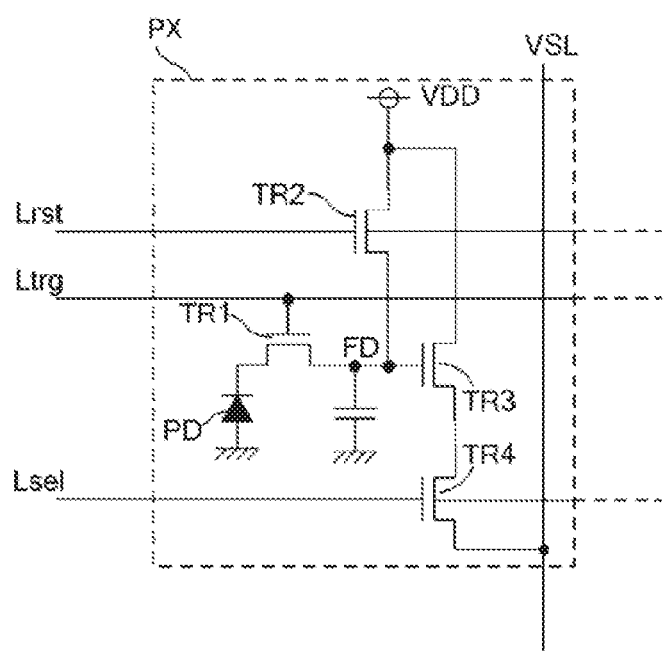
FIG. 2 is a diagram describing a circuit configuration of a pixel.

FIG. 2 is a diagram describing a circuit configuration of a pixel. The drawing shows an equivalent circuit of a pixel of a configuration of an ordinary four-transistor system. The pixel shown in the drawing includes a photodiode PD and four transistors (a transfer transistor TR1, a reset transistor TR2, an amplification transistor TR3, and a selection transistor TR4).

The photodiode PD generates a current in accordance with the amount of received light by photoelectric conversion.

The anode of the photodiode PD is connected to the ground, and the cathode is connected to the drain of the transfer transistor TR1.

Various control signals are inputted to the pixel PX from a reset signal generation circuit and various drivers of the vertical driving section 20 via signal lines Ltrg, Lrst, and Lsel.

Signal line Ltrg for transmitting a transfer gate signal is connected to the gate of the transfer transistor TR1. The source of the transfer transistor TR1 is connected to a connection point between the source of the reset transistor TR2 and the gate of the amplification transistor TR3. This connection point is included in a floating diffusion FD that is a capacitance that accumulates signal charge.

The transfer transistor TR1 becomes ON if a transfer signal is inputted to the gate through signal line Ltrg, and transfers signal charge (herein, photoelectrons) accumulated by photoelectric conversion of the photodiode PD to the floating diffusion FD.

Signal line Lrst for transmitting a reset signal is connected to the gate of the reset transistor TR2, and a constant voltage source VDD is connected to the drain of the reset transistor TR2. The reset transistor TR2 becomes ON if a reset signal is inputted to the gate through signal line Lrst, and resets the floating diffusion FD to the voltage of the constant voltage source VDD. On the other hand, in a case where a reset signal is not inputted to the gate through signal line Lrst, the reset transistor TR2 is OFF, and forms a prescribed potential barrier between the floating diffusion FD and the constant voltage source VDD.

In the amplification transistor TR3, the gate is connected to the floating diffusion FD, the drain is connected to the constant voltage source VDD, and the source is connected to the drain of the selection transistor TR4.

In the selection transistor TR4, signal line Lsel of a selection signal is connected to the gate, and the source is connected to the vertical signal line VSL. The selection transistor TR4 becomes ON if a control signal (an address signal or a selection signal) is inputted to the gate through signal line Lsel, and is OFF in a case where the control signal is not inputted to the gate through signal line Lsel.

If the selection transistor TR4 becomes ON, the amplification transistor TR3 amplifies the voltage of the floating diffusion FD, and outputs the amplified voltage to the vertical signal line VSL. Voltages outputted from pixels through vertical signal lines VSL are inputted to the A/D conversion sections 30a and 30b.

Note that the circuit configuration of the pixel may employ not only the configuration shown in FIG. 2 but also various known configurations such as a configuration of a three-transistor system and a configuration of another four-transistor system. Examples of the configuration of another four-transistor system include a configuration in which the selection transistor TR4 is placed between the amplification transistor TR3 and the constant voltage source VDD. Further, a configuration in which the floating diffusion FD is shared by a plurality of pixels is possible.

Figure 3:
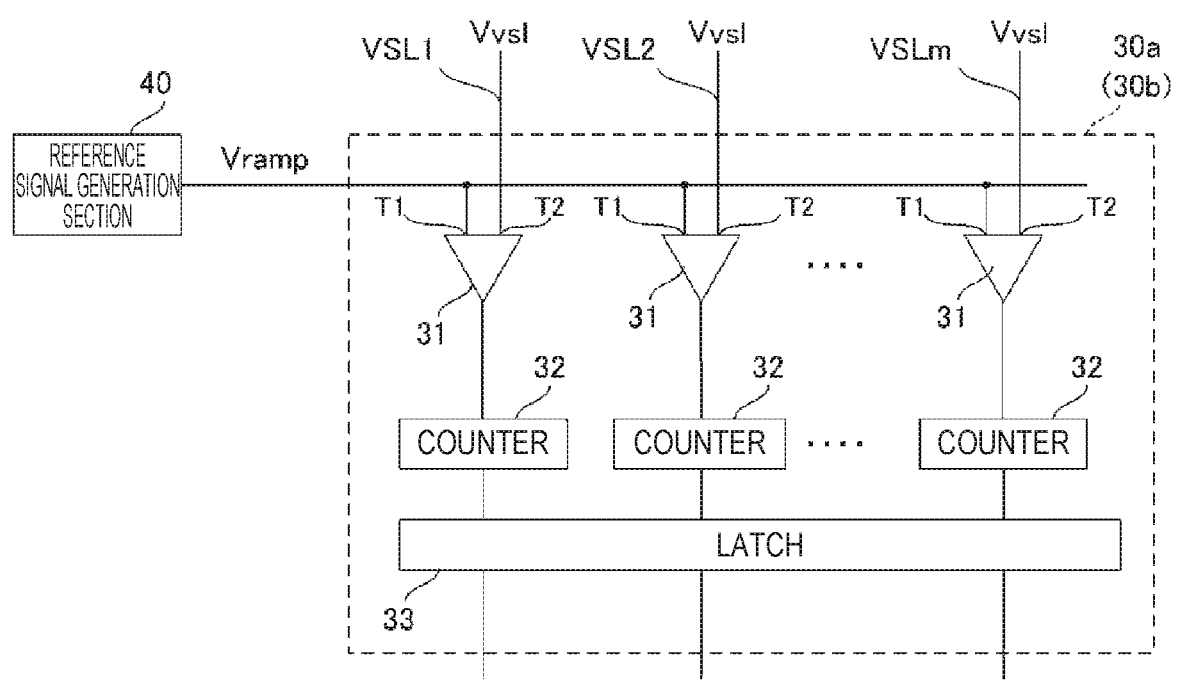
FIG. 3 is a diagram showing a configuration of an A/D conversion section.

FIG. 3 is a diagram showing a configuration of the A/D conversion section 30a or the A/D conversion section 30b. As shown in the drawing, each ADC circuit included in the A/D conversion section 30a or the A/D conversion section 30b includes a comparator 31 and a counter 32 provided for each vertical signal line VSLm, and a latch 33.

The comparator 31 includes two input terminals T1 and T2 and one output terminal T3. A reference signal Vramp is inputted to one input terminal T1 from the reference signal generation section 40, and an analog voltage of the vertical signal line VSL (a voltage Vvsl of the vertical signal line) is inputted to the other input terminal T2.

When a voltage in accordance with the voltage of the floating diffusion FD is outputted to the vertical signal line VSL, the comparator 31 compares the reference signal Vramp and the voltage Vvsl.

The comparator 31 is operable to output a high-level or low-level signal in accordance with the magnitude relationship between the reference signal Vramp and the voltage Vvsl; if the magnitude relationship between the reference signal Vramp and the voltage Vvsl is reversed, the output of the output terminal T3 is reversed between a high level and a low level.

The counter 32 is supplied with a clock from the communication and timing control section 60, and uses the clock to count the time from the start to the end of A/D conversion. The timings of the start and the end of A/D conversion are specified on the basis of a control signal outputted by the communication and timing control section 60 (for example, the presence or absence of input of a clock signal CLK, or the like) and an output reversal of the comparator 31.

Further, the counter 32 A/D-converts a voltage (a signal voltage) in accordance with a charge that is generated by the photodiode PD in accordance with the amount of incident light and is transferred to the floating diffusion FD, by what is called correlated double sampling (CDS). Specifically, in accordance with the control of the communication and timing control section 60, the counter 32 performs down-counting during the time when an analog signal equivalent to the voltage of the floating diffusion FD immediately after resetting (a reset voltage) is outputted from the vertical signal line VSLm (corresponding to a P-phase period described later). Then, with the count value obtained by the down-counting as the initial value, the counter 32 performs up-counting during the time when a signal voltage is outputted from the vertical signal line VSLm (corresponding to a D-phase period described later).

The count value thus generated is a digital value (a pixel signal) equivalent to the difference between the signal voltage and the reset voltage. That is, the pixel signal is a value obtained by calibrating, by the reset voltage, a digital value equivalent to an analog signal voltage inputted to the A/D conversion section 30a or the A/D conversion section 30b from the pixel through the vertical signal line VSLm.

Digital values as pixel signals generated by the counters 32 are stored in the latch 33; and are sequentially outputted from the latch 33 in accordance with the control of the horizontal scanning section, and are outputted to the signal processing section 70 via the horizontal signal line Ltrf.

Next, an A/D conversion operation of a solid-state imaging element is described with reference to FIG. 4. The A/D conversion operation shown in the drawing is executed repeatedly during the time when pixel signals of a plurality of pixels are sequentially read out.

The operation of readout of a pixel shown in the drawing mainly includes a reset operation, an AZ operation, a reset level acquisition operation, and a pixel signal level acquisition operation.

Figure 4:
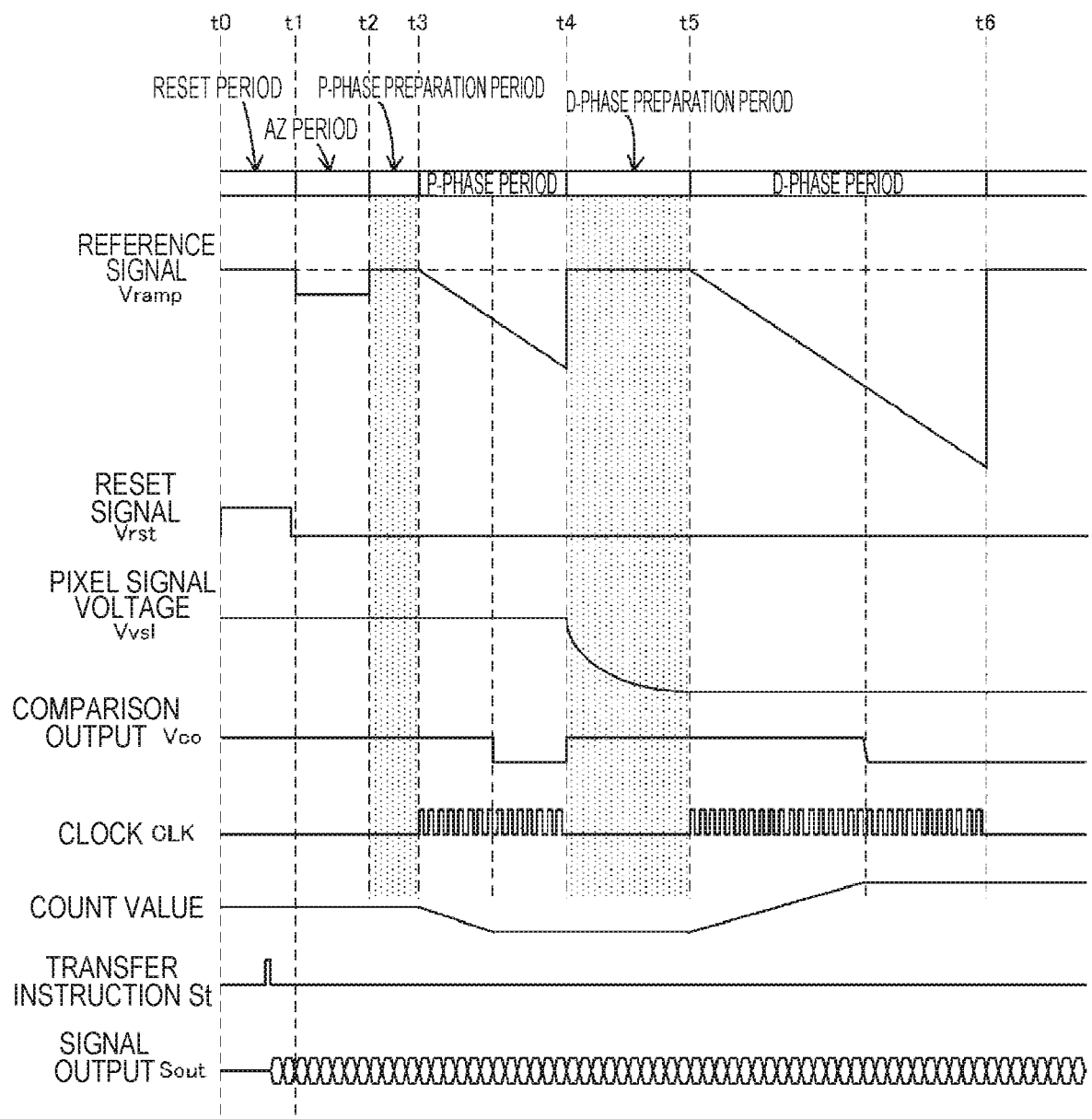
FIG. 4 is a diagram describing an A/D conversion operation of a solid-state imaging element.

The reset operation is executed in a reset period (t0 to t1) shown in FIG. 4, the reset level acquisition operation is executed in a P-phase period (t3 to t4) shown in FIG. 4, and the signal voltage level acquisition operation is executed in a D-phase period (t5 to t6) shown in FIG. 4. An AZ period (t1 to t2) for eliminating the potential difference between the input terminals T1 and T2 of the comparator 31 is provided between the reset period and the P-phase period.

A P-phase preparation period (t2 to t3) is provided immediately before the P-phase period, and a D-phase preparation period (t4 to t5) is provided immediately before the D-phase period. In the P-phase preparation period and the D-phase preparation period, the preparation of the A/D conversion operation performed in the P-phase period and the D-phase period, such as returning the reference signal Vramp to the initial value, is performed. Hereinbelow, these periods are described in order.

Note that, although in FIG. 4 the reference signal Vramp is described so as to rise at an acute angle at t2 when the P-phase preparation period is started or at t4 when the D-phase preparation period is started, in practice there is a wiring capacitance described later, and therefore the reference signal Vramp rises gradually at a prescribed time constant in accordance with the wiring capacitance.

In the reset period, a charge accumulated in the floating diffusion FD is swept and is reset to a prescribed standard voltage. Specifically, a reset pulse equivalent to the reset ON voltage described above is applied to the reset transistor TR2 of the pixel to be processed. Then, the reset transistor TR2 enters an ON state and the floating diffusion FD is electrically connected to the constant voltage source VDD, and the floating diffusion FD is reset to a prescribed level.

If the reset period ends, next, the AZ period and the P-phase preparation period follow, and then the P-phase period follows.

In the P-phase period, a reset level acquisition operation in which an analog voltage in accordance with the amount of charge accumulated in the reset pixel is converted to a digital value is executed.

Specifically, a reset pulse equivalent to the reset OFF voltage described above and a transfer pulse equivalent to the transfer OFF voltage described above are applied to the reset transistor TR2 and the transfer transistor TR1, respectively, of the pixel to be processed. On the other hand, a selection pulse equivalent to the selection ON voltage described above is applied to the selection transistor TR4.

Thereby, the reset transistor TR2 and the transfer transistor TR1 of the pixel to be processed enter an OFF state, and the selection transistor TR4 enters an ON state. In this event, the voltage Vvsl is a voltage obtained by, with the amplification transistor TR3, amplifying the voltage in the floating diffusion FD immediately after being reset.

In this event, the reference signal Vramp and the voltage Vvsl are inputted to the comparator 31, and the comparator 31 outputs a comparison output Vco in accordance with the magnitude relationship between the reference signal Vramp and the voltage Vvsl. The voltage Vvsl is the voltage of the vertical signal line VSL connected to the pixel to be A/D-converted, and the reference signal Vramp is a voltage that changes gradually with time from a prescribed standard value as the initial value in a certain period from the start to the end of A/D conversion.

If the reference signal Vramp and the voltage Vvsl cross and the magnitude relationship is reversed, the comparison output Vco changes between a high level and a low level. In the example shown in FIG. 4, the comparison output Vco is a high-level voltage in a case where the reference signal Vramp is larger than the voltage Vvsl, and is a low-level voltage in a case where the reference signal Vramp is smaller than the voltage Vvsl. The comparison output Vco thus generated is inputted to the counter 32.

The counter 32 performs counting during the period until the reference signal Vramp and the voltage Vvsl cross and the magnitude relationship is reversed. That is, in the present embodiment, the counter 32 performs counting in that period in the P-phase period in which the comparison output Vco is at a high level, and does not perform counting in a case where the comparison output Vco is at a low level.

Thereby, the counter 32 can count the time in the P-phase period from when A/D conversion is started to when the comparison output Vco and the reference signal Vramp cross. This count value is a digital value equivalent to the charge accumulated in the pixel in a reset state. Note that, as described above, the counter 32 performs down-counting in the P-phase period.

If the P-phase period ends, the D-phase preparation period for returning the reference signal Vramp to the initial value or the like follows; then, in the D-phase period, a signal voltage level acquisition operation in which a voltage (analog voltage) in accordance with the amount of charge generated by the photodiode PD in accordance with the amount of received light is converted to a digital value is executed.

Specifically, a reset pulse equivalent to the reset OFF voltage described above is applied to the reset transistor TR2 of the pixel to be processed. Further, a transfer pulse equivalent to the transfer OFF voltage described above is applied to the transfer transistor TR1, and a selection pulse equivalent to the selection ON voltage described above is applied to the selection transistor TR4.

Thereby, the reset transistor TR2 of the pixel to be processed enters an OFF state, and the transfer transistor TR1 and the selection transistor TR4 enter an ON state. In this event, a charge generated by the photodiode PD in accordance with the amount of received light is transferred to the floating diffusion FD, and the voltage Vvsl becomes a voltage obtained by amplifying the voltage of the floating diffusion FD with the amplification transistor TR3.

In this event, the reference signal Vramp and the voltage Vvsl are inputted to the comparator 31, like in the P-phase period described above. The comparator 31 outputs a voltage in accordance with the magnitude relationship between the reference signal Vramp and the voltage Vvsl. If the reference signal Vramp and the voltage Vvsl cross and the magnitude relationship is reversed, the comparison output Vco changes between a high level and a low level.

The counter 32 performs counting during the period until the reference signal Vramp and the voltage Vvsl cross and the magnitude relationship is reversed, like in the P-phase period. That is, in the present embodiment, the counter 32 performs counting in that period in the D-phase period in which the comparison output Vco is at a high level, and does not perform counting in a case where the comparison output Vco is at a low level.

Thereby, the counter 32 can count the time in the D-phase period from when A/D conversion is started to when the comparison output Vco and the reference signal Vramp cross. The count value in this event is a digital value equivalent to the amount of charge generated by the photodiode PD in accordance with the amount of received light. Note that, as described above, the counter 32 performs up-counting in the D-phase period, which is opposite to the counting in the P-phase period.

Further, in the D-phase period, the counter 32 performs counting using the counting result of the P-phase period as the initial value. Thereby, the count value held by the counter 32 at the time when the D-phase period ends is a digital value obtained by subtracting a count value equivalent to the voltage in accordance with the charge accumulated in the pixel in a reset state from a count value equivalent to the voltage in accordance with the charge that is generated by the photodiode PD in accordance with the amount of received light. That is, the value held by the counter 32 is a value in which a fixed noise component is removed by what is called correlated double sampling.

Digital values thus generated in the counters 32 are transferred to the latch 33 by the control of the communication and timing control section 60, and are sequentially outputted to the signal processing section 70 via the horizontal signal line Ltrf by the horizontal driving section 50a or 50b during the time when the next pixel values are A/D-converted in the comparators 31 and the counters 32. In the example shown in FIG. 4, a transfer instruction St is inputted from the horizontal driving section 50a or 50b in the reset period of the A/D conversion period of the next pixel value, and data transfer is performed during the time when the P-phase period and the D-phase period are executed.

Figure 5:
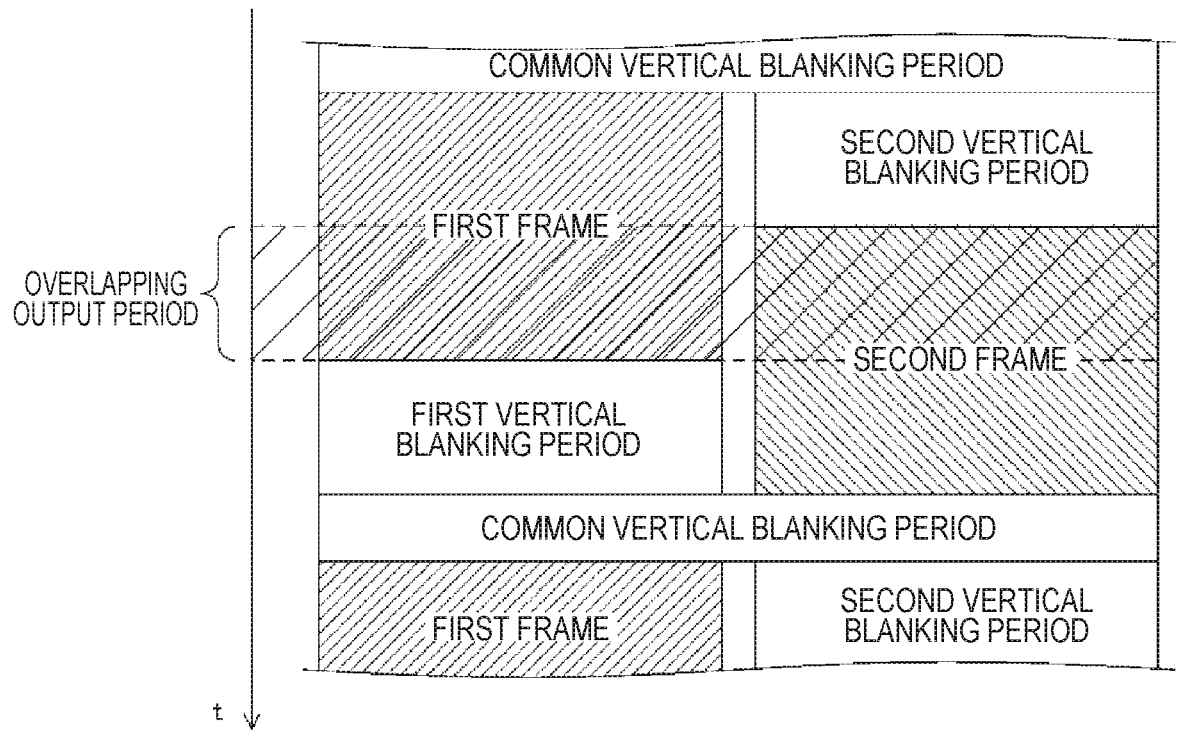
FIG. 5 is a diagram describing parallel output of a plurality of frames.

FIG. 5 is a diagram describing parallel output of a plurality of frames. The drawing shows an example in which two frames are parallel outputted, and there is an output overlapping period in which an output period of a first frame F1 and an output period of a second frame F2 overlap partially; the drawing shows an example in which the latter half portion of the first frame F1 and the first half portion of the second frame F2 overlap partially.

Figure 6:
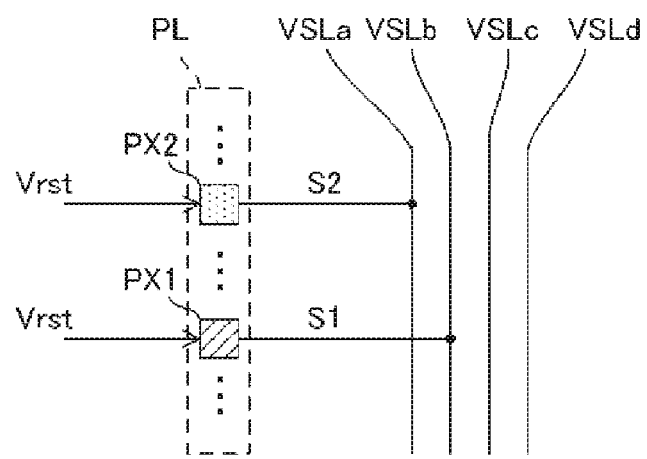
FIG. 6 is a diagram describing output timings of pixels in parallel output of a plurality of frames.

In the overlapping output period, one pixel PX1 and another pixel PX2 included in a pixel column PL output signals simultaneously as shown in FIG. 6. In this event, before the technology according to the present embodiment is applied, one pixel PX1 outputs signal S1 to be included in the first frame F1, and the other pixel PX2 outputs signal S2 to be included in the second frame F2. Pixel PX1 is connected to one of vertical signal lines VSLa to VSLd (in the drawing, vertical signal line VSLb), and pixel PX2 is connected to another of vertical signal lines VSLa to VSLd (in the drawing, vertical signal line VSLa). Note that, in the present embodiment, pixel PX1 is included in a first pixel, and pixel PX2 is included in a second pixel.

Since pixel PX1 and pixel PX2 are connected to mutually different vertical signal lines, signals outputted to the vertical signal lines do not overlap directly as a matter of course; however, there is a case where signals influence each other due to a capacitive coupling between the vertical signal lines of connection destinations. If the influence is more than a permissible value, one frame influences the other frame and a defect such as an unexpected appearance occurs in an image depicted on the basis of a signal outputted from pixel PX1 or PX2 in the overlapping output period. Note that the influence by a capacitive coupling between vertical signal lines can be reduced to some extent by providing a shield wiring between the vertical signal lines, but is difficult to completely suppress.

The present embodiment employs a configuration in which the output from pixel PX2 to the vertical signal line is disabled in a case where the capacitive coupling between the vertical signal line to which pixel PX1 is connected and the vertical signal line to which pixel PX2 is connected is more than a certain value, and the output from pixel PX2 to the vertical signal line is permitted in a case where the capacitive coupling is less than the certain value.

The standard of the threshold of the capacitive coupling serving as a standard is various; for example, the standard is set such that the capacitive coupling is less than a certain value in a case where a prescribed number of one or more of signal lines or shield lines exist between vertical signal lines, like between vertical signal line VSla and vertical signal line VSLd, and the capacitive coupling is more than the certain value in a case where a prescribed number of one or more of signal lines or shield lines do not exist between vertical signal lines, unlike between vertical signal line VSla and vertical signal line VSLd. In the following, a description is given on the assumption that, as an example, vertical signal line VSLa and vertical signal line VSLd shown in FIG. 6 have a capacitive coupling of less than a certain value and combinations of other vertical signal lines shown in FIG. 6 have capacitive couplings of more than the certain value.

Specifically, in a case where pixel PX1 and pixel PX2 are connected to vertical signal lines VSLa and VSLb, respectively, the output from pixel PX1 to vertical signal line VSLa is permitted, and the output from pixel PX2 to vertical signal line VSLb is disabled. Further, in a case where pixel PX1 and pixel PX2 are connected to vertical signal lines VSLa and VSLd, respectively, both outputs from pixel PX1 and pixel PX2 to vertical signal lines VSLa and VSLd, respectively, are permitted.

Hereinbelow, a description is given in more detail on the basis of FIG. 7 and FIG. 8.

Figure 7:
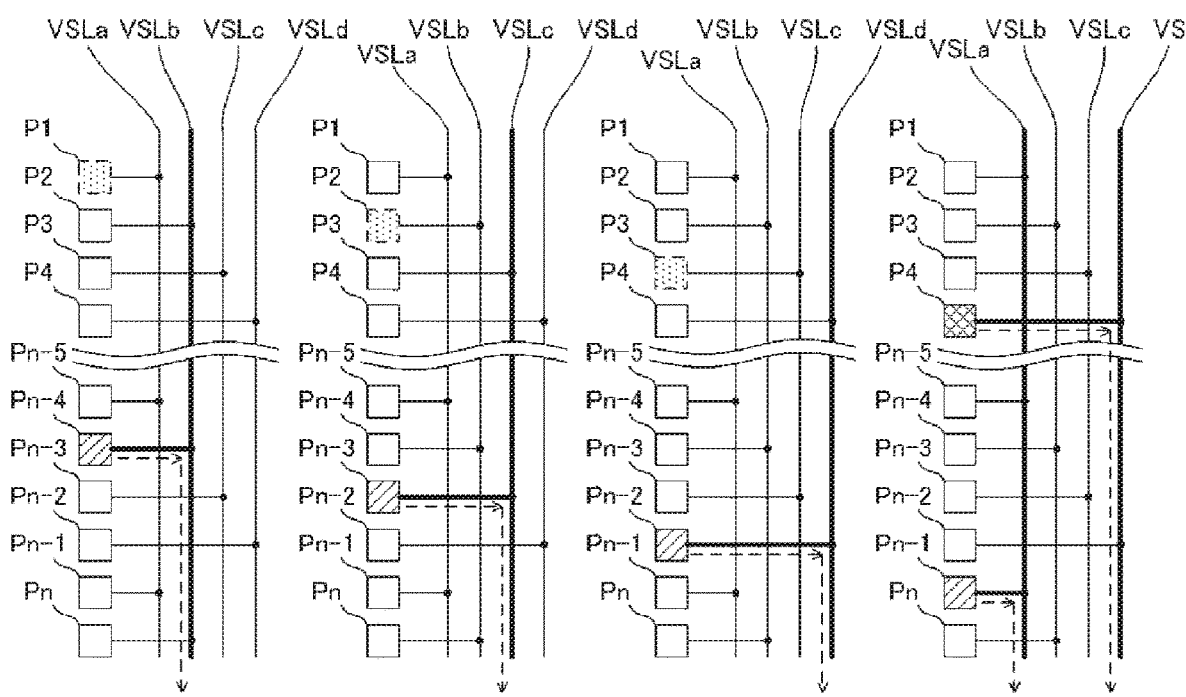
FIG. 7 is a diagram describing output timings of pixels more specifically.
Figure 8:
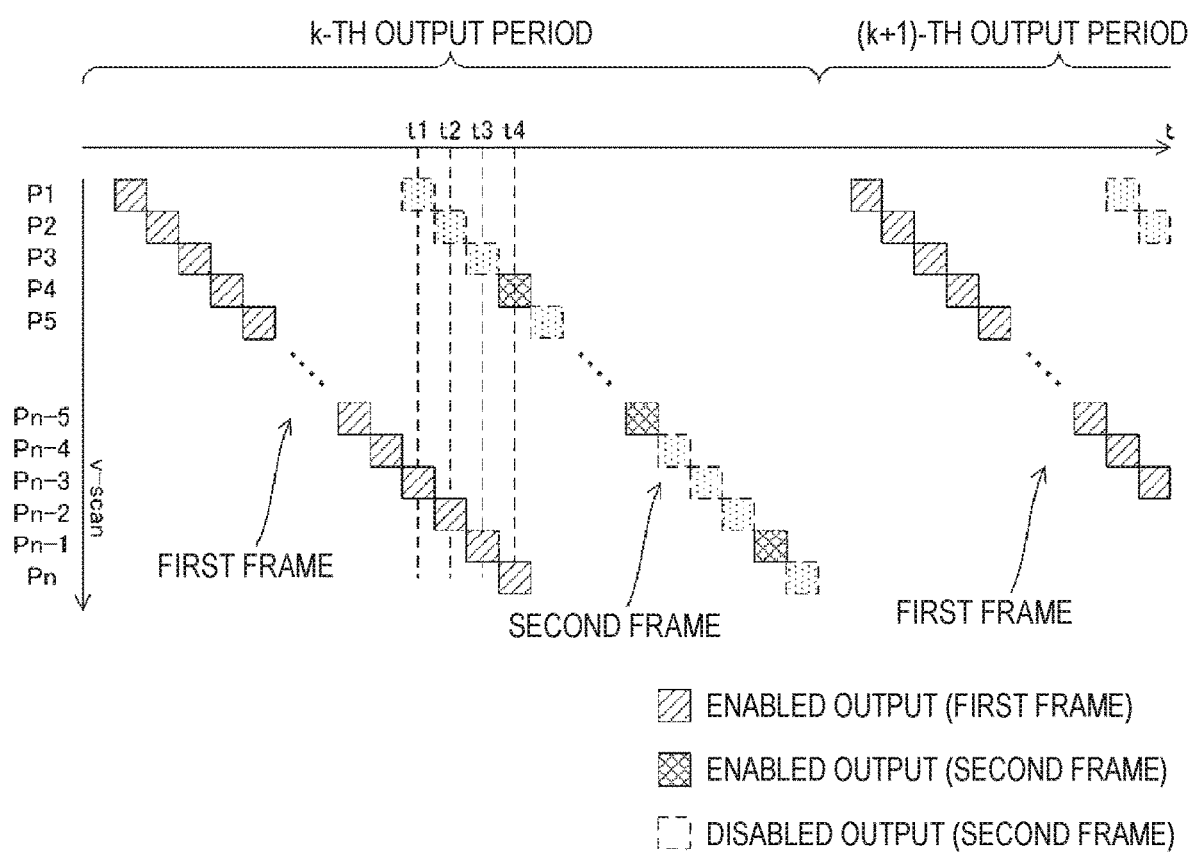
FIG. 8 is a diagram describing output timings of pixels more specifically.

In the example shown in FIG. 7 and FIG. 8, a pixel column PL includes a plurality of pixels P1 to Pn juxtaposed in a column form, and vertical signal lines VSLa to VSLd are provided so as to extend along the juxtaposition direction of the pixel column PL. Each of pixels P1 to Pn is connected to any one of vertical signal lines VSLa to VSLd, and pixels P1 to Pn are connected equally to vertical signal lines VSLa to VSLd. The vertical signal lines are juxtaposed in the order of L1 to VSLd.

For the output pixels of the first frame F1 and the output pixels of the second frame F2, output timings coincide at times t1, t2, t3, and t4 in the k-th output period.

Time t1 is a timing at which pixel P1 corresponding to pixel PX2 outputs a signal of the second frame F2 and pixel Pn-3 corresponding to pixel PX1 outputs a signal of the first frame F1.

Since vertical signal line VSLa to which pixel P1 is connected and vertical signal line VSLb to which pixel Pn-3 is connected are provided adjacent, the output from pixel Pn-3 to vertical signal line VSLb is permitted, and the output from pixel P1 to vertical signal line VSLa is disabled.

Time t2 is a timing at which pixel P2 corresponding to pixel PX2 outputs a signal of the second frame F2 and pixel Pn-2 corresponding to pixel PX1 outputs a signal of the first frame F1.

Since vertical signal line VSLb to which pixel P2 is connected and vertical signal line VSLc to which pixel Pn-2 is connected are provided adjacent, the output from pixel Pn-2 to vertical signal line VSLc is permitted, and the output from pixel P3 to vertical signal line VSLb is disabled.

Time t3 is a timing at which pixel P3 corresponding to pixel PX2 outputs a signal of the second frame F2 and pixel Pn-1 corresponding to pixel PX1 outputs a signal of the first frame F1.

Since vertical signal line VSLc to which pixel P3 is connected and vertical signal line VSLd to which pixel Pn-1 is connected are provided adjacent, the output from pixel Pn-1 to vertical signal line VSLd is permitted, and the output from pixel P3 to vertical signal line VSLc is disabled.

Time t4 is a timing at which pixel P4 corresponding to pixel PX2 outputs a signal of the second frame F2 and pixel Pn corresponding to pixel PX1 outputs a signal of the first frame F1. Since vertical signal line VSLd to which pixel P4 is connected and vertical signal line VSLa to which pixel Pn is connected are provided in a positional relationship of not being adjacent, the output from pixel Pn to vertical signal line VSLa is permitted, and also the output from pixel P4 to vertical signal line VSLa is permitted.

Here, a method for disabling the output from pixel PX2 to a vertical signal line is described with reference to FIG. 9. This disablement is performed in at least part of the P-phase period and the D-phase period, for example performed in a signal output period including at least one of the P-phase period or the D-phase period.

Figure 9:
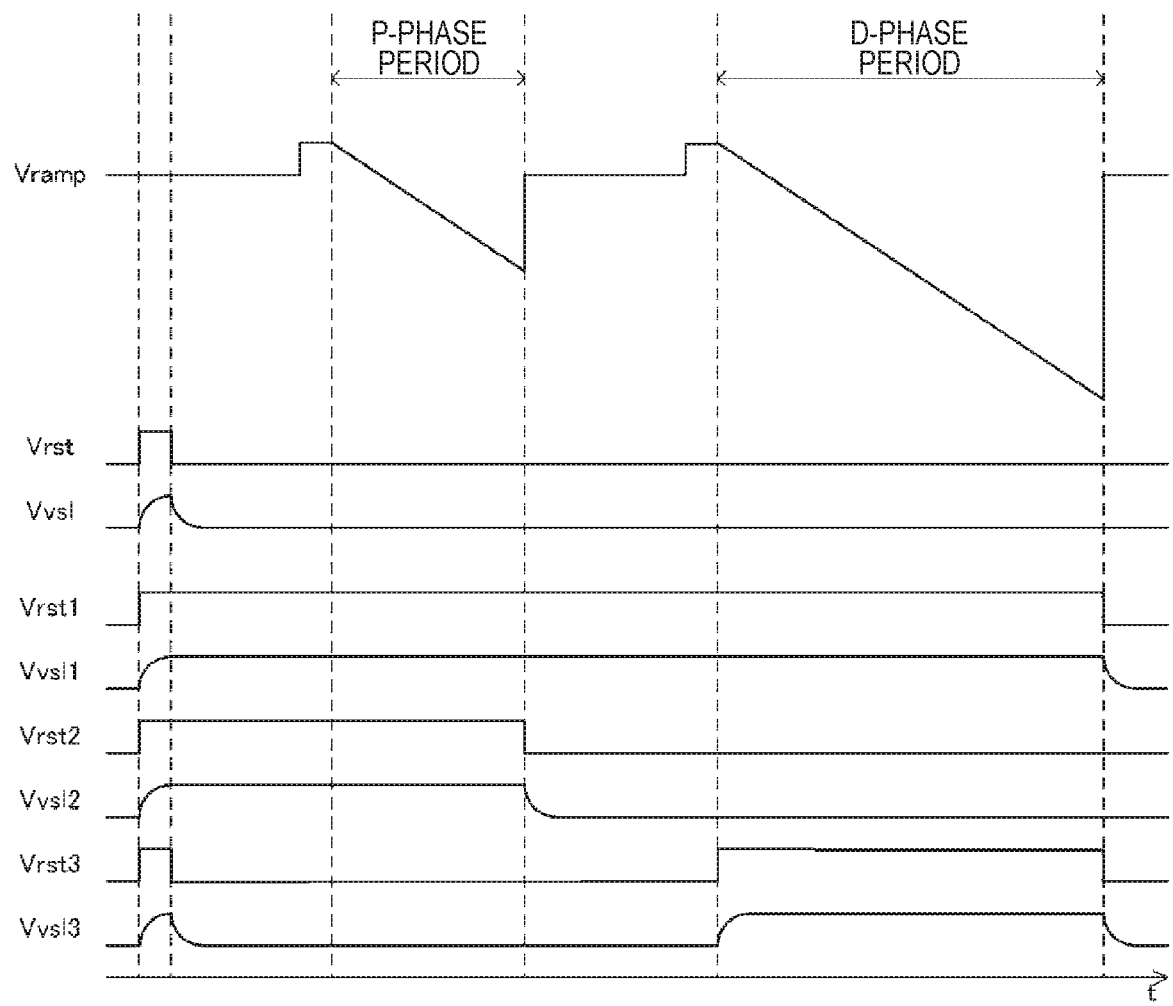
FIG. 9 is a diagram describing disablement using a reset signal.

FIG. 9 is a diagram describing disablement using a reset signal Vrst that is inputted to the gate of the reset transistor TR2 of pixel PX2 through signal line Lrst. The drawing shows reset signals Vrst1, Vrst2, and Vrst3 as variations of the reset signal used at the time of disabling pixel PX2 and voltages Vvsl1, Vvsl2, and Vvsl3 of the vertical signal line at the time of input of reset signals Vrst1, Vrst2, and Vrst3. Note that the drawing describes also an ordinary reset signal Vrst in a case where the output is not disabled (in a case where the output is permitted) and the voltage Vvsl of the vertical signal line VSL at the time of input of the reset signal Vrst.

Reset signal Vrst1 is an example of a reset signal that disables the output from pixel PX2 throughout both the P-phase period and the D-phase period. Specifically, reset signal Vrst1 is a signal that continuously performs the resetting of pixel PX2 during the time from the start of the reset period of pixel PX2 to the end of the D-phase period. Thereby, the voltage Vvsl1 of the vertical signal line to which pixel PX2 is connected is maintained to be a reset voltage throughout both the P-phase period and the D-phase period.

By using such a reset signal Vrst1, a situation in which a voltage outputted from pixel PX2 to the vertical signal line influences a signal outputted from pixel PX1 to the vertical signal line can be prevented throughout both the P-phase period and the D-phase period as a whole.

First, if the output from pixel PX2 is disabled in the P-phase period, specifically the following advantage is obtained. That is, there is a case where the reset operation performed in the reset period cannot reset the voltage of the floating diffusion FD of pixel PX2 due to blooming that is caused by an event in which high luminance light is incident on pixel PX2 and charge overflows from the photodiode.

This case leads to a situation in which a signal voltage of high luminance light is outputted to the vertical signal line during the P-phase period, in which a reset voltage is supposed to be outputted from pixel PX2 to the vertical signal line. To address this problem, conventionally an analog dummy pixel has been used to perform the following processing: the voltage of the vertical signal line is clamped in the AZ period, and the clamp of the voltage of the vertical signal line is released in the P-phase period; in this state, in a case where the P-phase period experiences full counting, this case is determined as blooming, and an appropriate signal value is used as a substitute. That is, conventionally the output value of pixel PX2 has been corrected to an appropriate signal.

However, the voltage outputted from pixel PX2 to the vertical signal line during the P-phase period gives influence also to the reset voltage outputted from pixel PX1 to the vertical signal line due to the capacitive coupling described above, and there is a case where the reset voltage serving as a standard of the output signal of pixel PX1 is determined as low. If the reset signal of pixel PX1 is determine as lower than a normal value, black sinking occurs in the image of the first frame F1. Thus, by disabling the output from pixel PX2 in the P-phase period in a case where the capacitive coupling is more than a certain value, black sinking occurring in the image of the first frame F1 can be prevented.

Further, if the output from pixel PX2 is disabled in the D-phase period, there is an advantage that color shifting of the first frame F1 and color shifting of the second frame F2 occurring due to interference between the first frame F1 and the second frame F2 can be suppressed. That is, the signal voltage outputted from pixel PX2 to the vertical signal line and the signal voltage outputted from pixel PX1 to the vertical signal line influence each other due to the capacitive coupling described above. Thus, by disabling the output from pixel PX2 in the D-phase period in a case where the capacitive coupling is more than a certain value, such color shifting occurring in the image of the first frame F1 can be prevented.

Reset signal Vrst2 is an example of a reset signal that disables the output from pixel PX2 in the P-phase period. Specifically, reset signal Vrst2 is a signal that continuously performs the resetting of pixel PX2 during the time from the start of the reset period of pixel PX2 to the end of the P-phase period.

By using reset signal Vrst2, the voltage Vvsl2 of the vertical signal line to which pixel PX2 is connected is maintained to be a reset voltage in the P-phase period. Hence, a situation in which a voltage outputted from pixel PX2 to the vertical signal line influences a signal outputted from pixel PX1 to the vertical signal line can be prevented in the P-phase period.

Reset signal Vrst3 is an example of a reset signal that disables the output from pixel PX2 in the D-phase period. Specifically, reset signal Vrst3 is a signal that continuously performs the resetting of pixel PX2 during the time from the start of the D-phase period of pixel PX2 to the end of the D-phase period.

By using reset signal Vrst3, the voltage Vvsl3 of the vertical signal line to which pixel PX2 is connected is maintained to be a reset voltage in the D-phase period. Hence, a situation in which a voltage outputted from pixel PX2 to the vertical signal line influences a signal outputted from pixel PX1 to the vertical signal line can be prevented in the D-phase period.

Figure 10:
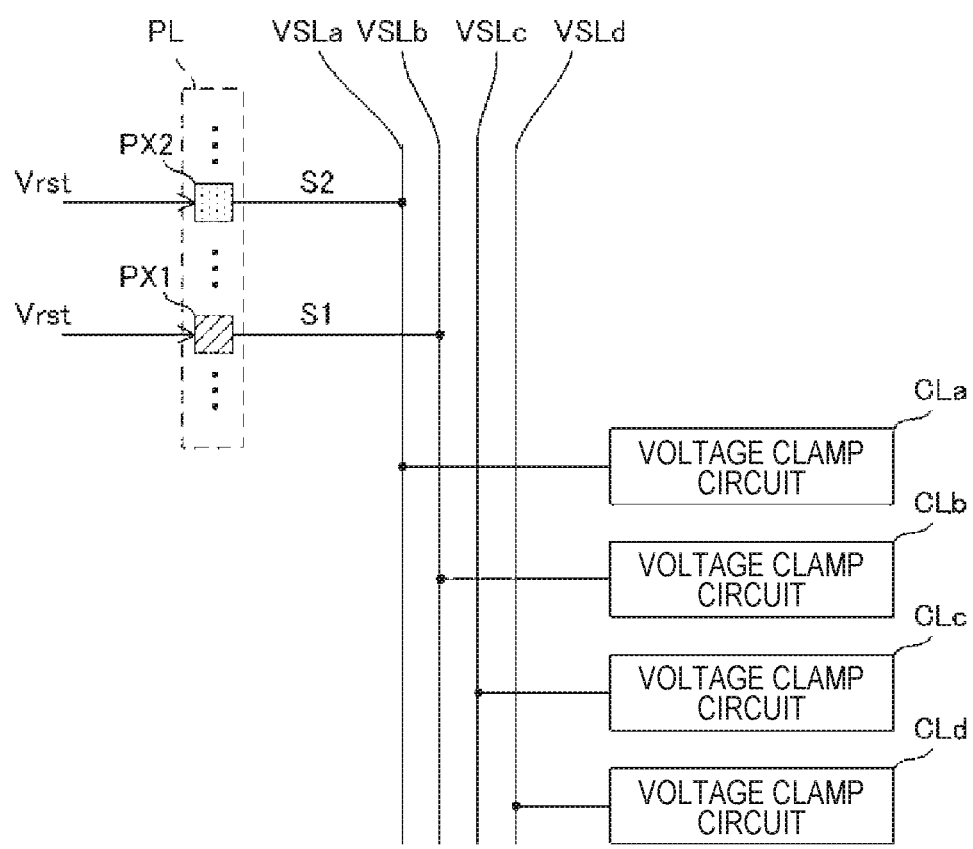
FIG. 10 is a diagram describing disablement using voltage clamp circuits.

FIG. 10 is a diagram describing disablement using voltage clamp circuits CLa to CLd connected to vertical signal lines. Variations of the ON periods of voltage clamp circuits CLa to CLd each of which disables pixel PX2 are similar to the ON periods of the reset signals described above, and also the voltages Vvsl1, Vvsl2, and Vvsl3 of the vertical signal line in this event are similar.

Each of voltage clamp circuits CLa to CLd includes a source follower circuit using a MOS transistor, for example. In the MOS transistor, the drain is connected to a constant voltage source, the source is connected to a vertical signal line, and ON/OFF switching is performed by an input to the gate. If the MOS transistor becomes turn-on, each of voltage clamp circuits CLa to CLd clamps the vertical signal line at the voltage of the constant voltage source; if the MOS transistor becomes turn-off, each of voltage clamp circuits CLa to CLd is separated from the voltage of the vertical signal line.

Each of voltage clamp circuits CLa to CLd may be provided as a dedicated one in order to clamp the voltage of the vertical signal line, or may be obtained by using a conventional configuration of a solid-state imaging element. Specifically, a pixel other than the pixels included in the image of the first frame F1 or the second frame F2 (for example, an effective optical black pixel, an ineffective optical black pixel, an unused pixel in the effective pixel region, or the like) may be used. In this case, a reset voltage similar to reset voltages Vrst1, Vrst2, and Vrst3 described above is inputted to a pixel used as each of voltage clamp circuits CLa to CLd. Further, a source follower circuit that is similar to each of voltage clamp circuits CLa to CLd and that is provided in an analog dummy region in advance may be used.

Note that another vertical signal line not connected to pixel PX1 or pixel PX2 is set in a high impedance state, for example. By setting the other vertical signal line in a high impedance state, the time until the voltage of the vertical signal line connected to each of pixel PX1 and pixel PX2 substantially coincides with the voltage of the floating diffusion of each of pixel PX1 and pixel PX2 can be shortened.

Conversely, another vertical signal line not connected to pixel PX1 or pixel PX2 may be set in a low impedance state, for example. By setting the other vertical signal line in a low impedance state, the other vertical signal line functions as a shield that lessens the influence of the capacitive coupling between the vertical signal line connected to pixel PX1 and the vertical signal line connected to pixel PX2 at the time when both pixel PX1 and pixel PX2 output signals to the vertical signal lines. Thereby, black sinking prevention effect and color shifting prevention effect are improved more.

Note that, although in the embodiment described above an example in which a first frame F1 with a high resolution is imaged earlier and a second frame F2 with a low resolution is imaged later is described, the first frame F1 imaged earlier may have a low resolution and the second frame F2 imaged later may have a high resolution. Use manners of the first frame F1 and the second frame F2 having mutually different resolutions are various; for example, a usage in which the second frame F2 images the moment of a flash and uses only luminance information, and color information used for actual picture making is acquired from the first frame F1 is possible. Further, also a usage in which pixels of which the outputs are permitted in the second frame F2 are used as image surface phase difference pixels, and color information and luminance information used for actual picture making are acquired from the first frame F1 is possible. Further, also a usage in which low resolution data obtained as the second frame F2 are used as a preview image and high resolution data obtained as the first frame F1 are saved is possible. Further, either one of the first frame F1 and the second frame F2 does not need to be the entire effective pixel region of the pixel section 10, and at least one of the first frame F1 or the second frame F2 may be obtained by data acquired from pixels in a partial area of the effective pixel region of the pixel section 10 (at least a part overlaps between the first frame F1 and the second frame F2).

(B) Second Embodiment

FIG. 11 is a block diagram showing a configuration of an imaging device 200 including a solid-state imaging element. The imaging device 200 shown in the drawing is an example of an electronic apparatus.

Note that, in the present specification, the imaging device refers to all electronic apparatus using a solid-state imaging device for an image capture section (a photoelectric conversion section), such as imaging devices such as digital still cameras and digital video cameras, and mobile terminal devices such as mobile phones having imaging functions. As a matter of course, examples of the electronic apparatus using a solid-state imaging device for an image capture section include also copying machines using a solid-state imaging device for an image reading section. Further, in order to be mounted on the electronic apparatuses described above, the imaging device may be a module in which components including a solid-state imaging element are modularized.

In FIG. 11, the imaging device 200 includes an optical system 211 including a lens group, a solid-state imaging element 100, a digital signal processor (DSP) 213, a frame memory 214, a display device 215, a recording device 216, a manipulation system 217, a power source system 218, and a control section 219.

The DSP 213, the frame memory 214, the display device 215, the recording device 216, the manipulation system 217, the power source system 218, and the control section 219 are connected together via a communication bus so as to be able to transmit and receive data and signals with each other.

The optical system 211 captures incident light (image light) from a subject, and forms an image on an imaging surface of a solid-state imaging element 12. The solid-state imaging element 12 generates, on a pixel basis, an electrical signal in accordance with the amount of received incident light that is formed as an image on the imaging surface by the optical system 211, and outputs the electrical signal as a pixel signal. The pixel signal is inputted to the DSP 213, and is subjected to various pieces of image processing as appropriate; then, is stored in the frame memory 214, recorded on a recording medium of the recording device 216, and outputted to the display device 215.

The display device 215 includes a panel-type display device such as a liquid crystal display device or an organic electro-luminescence (EL) display device, and displays moving images and still images captured by the solid-state imaging element 12 and other information. The recording device 216 records moving images and still images captured by the solid-state imaging element 12 on a recording medium such as a digital versatile disk (DVD), a hard disk (HD), or a semiconductor memory.

The manipulation system 217 accepts various manipulations from the user, and transmits manipulation orders in accordance with the user's manipulations to the sections 213, 214, 215, 216, 218, and 219 via the communication bus. The power source system 218 generates various power supply voltages serving as driving power sources, and supplies the power supply voltages to supply destinations (the sections 212, 213, 214, 215, 216, 217, and 219), as appropriate.

The control section 219 includes a CPU that performs arithmetic processing, a ROM that stores a control program of the imaging device 200, a RAM functioning as a work area of the CPU, etc. Using the RAM as a work area, the control section 219 controls the sections 213, 214, 215, 216, 217, and 218 via the communication bus by the CPU executing the control program stored in the ROM. Further, the control section 219 controls a not-illustrated timing generator to generate various timing signals, and performs control for supplying the timing signals to the sections.

Note that the present technology is not limited to the embodiments described above, and includes also configurations in which configurations disclosed in each of the embodiments described above are substituted with each other or combinations are changed, configurations in which known technology and configurations disclosed in each of the embodiments described above are substituted with each other or combinations are changed, etc. Further, the technical scope of the present technology is not limited to the embodiments described above, and includes also the subject matters described in the claims and the equivalents thereof.

Additionally, the present technology may also be configured as below.

(1)

A solid-state imaging element including:

a pixel column in which a plurality of pixels are juxtaposed in a column form;

three or more juxtaposed signal lines each used for an output of a pixel included in the pixel column; and an A/D conversion section configured to convert an analog voltage outputted by the pixel to the signal line to a digital value, in which, for a first pixel and a second pixel included in the pixel column, signal lines of connection destinations of these pixels are different from each other, and timings of outputs of analog voltages of these pixels to the signal lines coincide, an output from the first pixel to the signal line is permitted and an output from the second pixel to the signal line is disabled in a case where a prescribed number of one or more of signal lines or shield lines do not exist between the signal line that is a connection destination of the first pixel and the signal line that is a connection destination of the second pixel, and both outputs from the first pixel and the second pixel to the signal lines are permitted in a case where the prescribed number or more of signal lines or shield lines exist between the signal line that is a connection destination of the first pixel and the signal line that is a connection destination of the second pixel.

(2)

The solid-state imaging element according to (1), in which a floating diffusion of the second pixel is reset in at least part of an output period of a reset voltage from the second pixel to the signal line and an output period of a signal voltage from the second pixel to the signal line, and thereby the output from the second pixel to the signal line is disabled.

(3)

The solid-state imaging element according to (1), in which the signal line of a connection destination of the second pixel is connected to a constant voltage source, and thereby the output from the second pixel to the signal line is disabled.

(4)

The solid-state imaging element according to any one of (1) to (3), in which an output of a reset voltage from the second pixel to the signal line is disabled.

(5)

The solid-state imaging element according to (4), in which the output from the second pixel to the signal line is continuously disabled during a time from when a floating diffusion of the second pixel is reset to when an output of a reset potential of the floating diffusion to the signal line ends.

(6)

The solid-state imaging element according to any one of (1) to (4), in which an output of a signal voltage from the second pixel to the signal line is disabled.

(7)

The solid-state imaging element according to (6), in which the output from the second pixel to the signal line is continuously disabled during a time from when a floating diffusion of the second pixel is reset to when an output of a signal voltage transferred to the floating diffusion to the signal line ends.

(8)

The solid-state imaging element according to any one of (1) to (7), in which the signal line other than the signal lines connected to the first pixel and the second pixel is controlled to a high impedance.

(9)

The solid-state imaging element according to any one of (1) to (7), in which the signal line other than the signal lines connected to the first pixel and the second pixel is controlled to a low impedance.

(10)

A method for controlling a solid-state imaging element, the solid-state imaging element including a pixel column in which a plurality of pixels are juxtaposed in a column form, three or more juxtaposed signal lines each used for an output of a pixel included in the pixel column, and an A/D conversion section configured to convert an analog voltage outputted by the pixel to the signal line to a digital value, in which, for a first pixel and a second pixel included in the pixel column, signal lines of connection destinations of these pixels are different from each other, and timings of outputs of analog voltages of these pixels to the signal lines coincide, the method including:

a step of permitting an output from the first pixel to the signal line and disabling an output from the second pixel to the signal line in a case where a prescribed number of one or more of signal lines or shield lines do not exist between the signal line that is a connection destination of the first pixel and the signal line that is a connection destination of the second pixel; and a step of permitting both outputs from the first pixel and the second pixel to the signal lines in a case where the prescribed number or more of signal lines or shield lines exist between the signal line that is a connection destination of the first pixel and the signal line that is a connection destination of the second pixel.

REFERENCE SIGNS LIST 10 pixel section
20 vertical driving section
30a, 30b analog/digital conversion section (A/D conversion section)
31 comparator
32 counter
33 latch
40 reference signal generation section
50a, 50b horizontal driving section
60 timing control section
70 signal processing section
100 solid-state imaging element
200 imaging device
211 optical system
212 solid-state imaging element
213 DSP
214 frame memory
215 display device
216 recording device
217 manipulation system
218 power source system
219 control section
CLa to CLd voltage clamp circuit
F1 first frame
F2 second frame
FD floating diffusion
HSLn pixel driving line
Lrst signal line
Lsel signal line
Ltrf horizontal signal line
Ltrg signal line
P1 to Pn, PX1, PX2 pixel
PD photodiode
PL pixel column
St transfer instruction
T1 input terminal
T2 input terminal
T3 output terminal
TR1 transfer transistor
TR2 reset transistor
TR3 amplification transistor
TR4 selection transistor
VDD constant voltage source
VSL, VSLm, VSLa, VSLb, VSLc, VSLd vertical signal line

The invention claimed is:

1. A solid-state imaging element, comprising:
   a pixel column in which a plurality of pixels is juxtaposed in a column form;
   three or more juxtaposed signal lines each used for an output of a pixel included in the pixel column; and
   an A/D conversion section configured to convert an analog voltage outputted by the pixel to the three or more juxtaposed signal lines to a digital value,
   wherein, for a first pixel and a second pixel included in the pixel column, the three or more juxtaposed signal lines of connection destinations of the plurality of pixels are different from each other, and timings of outputs of analog voltages of the plurality of pixels to the three or more juxtaposed signal lines coincide,
   an output from the first pixel to a first signal line of the three or more juxtaposed signal lines is permitted and an output from the second pixel to a second signal line of the three or more juxtaposed signal lines is disabled in a case where a prescribed number of one or more of signal lines or shield lines do not exist between the first signal line that is a connection destination of the first pixel and the second signal line that is a connection destination of the second pixel, and
   both outputs from the first pixel to the first signal line and from the second pixel to the second signal line are permitted in a case where the prescribed number or more of the one or more of signal lines or the shield lines exist between the first signal line that is the connection destination of the first pixel and the second signal line that is the connection destination of the second pixel.

2. The solid-state imaging element according to claim 1, wherein a floating diffusion of the second pixel is reset in at least part of an output period of a reset voltage from the second pixel to the second signal line and an output period of a signal voltage from the second pixel to the second signal line, and thereby the output from the second pixel to the second signal line is disabled.

3. The solid-state imaging element according to claim 1, wherein the second signal line of the connection destination of the second pixel is connected to a constant voltage source, and thereby the output from the second pixel to the second signal line is disabled.

4. The solid-state imaging element according to claim 1, wherein an output of a reset voltage from the second pixel to the second signal line is disabled.

5. The solid-state imaging element according to claim 4, wherein the output from the second pixel to the second signal line is continuously disabled during a time from when a floating diffusion of the second pixel is reset to when the output of the reset voltage of the floating diffusion to the second signal line ends.

6. The solid-state imaging element according to claim 1, wherein an output of a signal voltage from the second pixel to the second signal line is disabled.

7. The solid-state imaging element according to claim 6, wherein the output from the second pixel to the second signal line is continuously disabled during a time from when a floating diffusion of the second pixel is reset to when the output of the signal voltage transferred to the floating diffusion to the second signal line ends.

8. The solid-state imaging element according to claim 1, wherein a third signal line other than the first signal line and the second signal line connected to the first pixel and the second pixel is controlled to a high impedance.

9. The solid-state imaging element according to claim 1, wherein a third signal line other than the first signal line and the second signal line connected to the first pixel and the second pixel is controlled to a low impedance.

10. A method for controlling a solid-state imaging element, the method comprising:
    in the solid-state imaging element including
        a pixel column in which a plurality of pixels is juxtaposed in a column form,
        three or more juxtaposed signal lines each used for an output of a pixel included in the pixel column, and
        an A/D conversion section configured to convert an analog voltage outputted by the pixel to the three or more juxtaposed signal lines to a digital value,
    wherein, for a first pixel and a second pixel included in the pixel column, the three or more juxtaposed signal lines of connection destinations of the plurality of pixels are different from each other, and timings of outputs of analog voltages of the plurality of pixels to the three or more juxtaposed signal lines coincide:
    permitting an output from the first pixel to a first signal line of the three or more juxtaposed signal lines and disabling an output from the second pixel to a second signal line of the three or more juxtaposed signal lines in a case where a prescribed number of one or more of signal lines or shield lines do not exist between the first signal line that is a connection destination of the first pixel and the second signal line that is a connection destination of the second pixel; and
    permitting both outputs from the first pixel to the first signal line and from the second pixel to the second signal line in a case where the prescribed number or more of the one or more of signal lines or the shield lines exist between the first signal line that is the connection destination of the first pixel and the second signal line that is the connection destination of the second pixel.

* * * * *